(12) United States Patent
Spinger et al.

(10) Patent No.: US 10,473,304 B1
(45) Date of Patent: Nov. 12, 2019

(54) REDUCING THERMAL SENSITIVITY OF A LIGHTING ARRANGEMENT

(71) Applicant: Lumileds LLC, San Jose, CA (US)

(72) Inventors: Benno Spinger, Aachen (DE); Florent Monestier, Aachen (DE); Juergen Mertens, Aachen (DE)

(73) Assignee: LUMILEDS LLC, San Jose, CA (US)

(*) Notice: Subject to any disclaimer, the term of this patent is extended or adjusted under 35 U.S.C. 154(b) by 0 days.

(21) Appl. No.: 16/063,453

(22) PCT Filed: Sep. 27, 2017

(86) PCT No.: PCT/EP2017/074532
§ 371 (c)(1),
(2) Date: Jun. 18, 2018

(87) PCT Pub. No.: WO2018/065278
PCT Pub. Date: Apr. 12, 2018

(30) Foreign Application Priority Data

Oct. 4, 2016 (EP) .................................. 16192238

(51) Int. Cl.
*F21V 3/00* (2015.01)
*F21V 5/00* (2018.01)
*F21V 19/00* (2006.01)
*H01S 5/022* (2006.01)
*F21V 14/00* (2018.01)
*G02B 7/02* (2006.01)

(52) U.S. Cl.
CPC ........ *F21V 19/0015* (2013.01); *F21V 14/006* (2013.01); *G02B 7/028* (2013.01); *H01S 5/02288* (2013.01)

(58) Field of Classification Search
CPC ..... F21V 14/00–006; F21V 14/06–065; F21V 19/001–007; G02B 7/028; H01S 5/02–0228
USPC ............. 362/249.02–249.04, 249.07–249.11, 362/311.02, 433–456
See application file for complete search history.

(56) References Cited

U.S. PATENT DOCUMENTS 5,270,870 A   12/1993 O'Brien et al.
2012/0206915 A1   8/2012 Batty

FOREIGN PATENT DOCUMENTS

DE   102008047277 A1   4/2010
EP   0454174 A1   10/1991
(Continued)

*Primary Examiner* — Jason M Han
(74) *Attorney, Agent, or Firm* — Volpe and Koenig, P.C.

(57) ABSTRACT

The invention relates to a lighting arrangement with at least one LED lighting element (15) arranged on a support member (12). An optical element (16) is arranged spaced from the LED lighting element (15) in a first direction O. A holder (14) is provided to hold the optical element (16) in a position relative to the LED lighting element (15). The holder (14) comprises at least a first holding portion (24a) extending from the support member (12) into the first direction O and a second holding portion (24b) connected to the optical element (16). The second holding portion (24b) is arranged such that at least a part extends into the first direction O. The second holding portion (26b) is spaced from the first holding portion (24a) in a direction traverse to the first direction O. In the case of distortions due to temperature changes and a mismatch of the coefficient of thermal expansion, the lighting arrangement minimizes variations in the displacement of the optical element (16) relative to the LED lighting element (15).

11 Claims, 7 Drawing Sheets

(56) References Cited

FOREIGN PATENT DOCUMENTS

| | | | |
|---|---|---|---|
| EP | 2306077 | A2 | 4/2011 |
| EP | 2884157 | A2 | 6/2015 |
| JP | 2003-185904 | A | 7/2003 |

REDUCING THERMAL SENSITIVITY OF A LIGHTING ARRANGEMENT

FIELD OF THE INVENTION

The invention relates to the field of lighting, and more specifically to a lighting arrangement comprising at least one LED lighting element and an optical element.

BACKGROUND OF THE INVENTION

Lighting arrangements with LEDs are used for an ever increasing number of lighting applications. In many cases, an optical element is arranged in front of an LED to alter the light emission, such as e.g. a lens, a reflector and/or a collimator to obtain an emitted light beam of desired properties.

The properties of the emitted light may depend on the exact positioning of the optical element relative to the LED. An exact positioning of the optical element is therefore advantageous.

DE 10 2008 047 277 A1 shows a device having a carrier arrangement holding an objective to change a focal plane relative to a charge coupled device chip. The objective is arranged in a section of a compensation body that extends along an optical axis, wherein the compensation body is connected in another section with the carrier arrangement. The compensation body includes a material with a thermal expansion coefficient, which is measured such that a temperature-dependent change of the arrangement of the focal plane to the optical component is balanced.

U.S. Pat. No. 5,270,870 A discloses an athermalized beam source and collimator assembly includes a collimator lens spaced from a circular foldback flexure plate by a lens barrel. The circular foldback flexure plate incorporates a circular foldback flexure adjacent the beam source mount to isolate the beam source from the ambient environment and to athermalize the assembly. The beam source mount and circular foldback flexure plate are composed of a material that is identical in composition and CTE as the portion of the beam source that is attached to the beam source mount.

EP 2 884 157 A2 shows a motor vehicle headlamp with at least one semiconductor light source and a primary optical system which collects light emitted from the semiconductor light source and is directed to a secondary optical system, wherein the primary optical system receives the light from the light source via a light entry surface and the light is emitted out via a light exit surface, wherein the primary optical system has a connecting flange with which the primary optical system is kept in a holder in at least two fixed bearings, wherein a first section of the connecting flange is curved like a dome.

SUMMARY OF THE INVENTION

It may be considered an object to achieve stable positioning of an optical element over a wide range of operating conditions.

This may be achieved by a lighting arrangement according to claim 1. Dependent claims refer to preferred embodiments.

The present inventors have considered that thermal changes, e.g. due to a change in ambient temperature or due to LED electrical operating power dissipated as heat, may significantly influence a holding structure provided to mount an optical element relative to an LED. In particular, if the structure supporting the LED and the optical element is comprised of different parts or different materials with a differing coefficient of thermal expansion (CTE), the structure may undergo distortions with increasing temperature that could lead to variations in the relative arrangement of the LED and the optical element. In order to improve the thermal stability of the positioning of the optical element, the inventors have proposed a special structure which has proven to have relatively low temperature sensitivity even for significant CTE mismatch.

The lighting arrangement according to the invention comprises at least one LED lighting element. The term LED lighting element should be understood to comprise any type of solid state lighting element, such as e.g. light emitting diodes, organic light emitting diodes, laser diodes, etc. An LED lighting element may comprise a single one or a plurality of several of such solid state lighting elements, e.g. one or a plurality of light emitting diodes arranged in close proximity.

One or several of such LED lighting elements may be arranged on a support member, and at least one optical element may be arranged spaced from the LED lighting element in a first direction, e.g. along an optical axis. Preferably, the optical element may be arranged directly in front of the LED lighting element, particularly preferred in the main light emission direction, e.g. perpendicular to a light emitting surface of the LED lighting element.

The optical element may be any type of element with an optical function, in particular to alter the beam of light emitted from the LED lighting element. The optical element may thus comprise or be comprised of a reflector, a collimator, a lens, an optical filter, a baffle, etc, or a combination of such elements. Preferably, it is made of or at least comprises a transparent or translucent material. The optical element preferably receives light from the LED lighting element and emits a modified beam, which may be e.g. focussed, collimated, redirected, filtered etc.

A holder is provided to hold the optical element in a position relative to the LED lighting element. The holder according to the invention has a specially designed structure, such that it comprises at least a first and a second holding portion. The first holding portion extends from the support member into the first direction and the second holding portion, which is connected directly or indirectly to the optical element, is arranged such that at least a part of it also extends into the first direction. The second holding portion is spaced from the first holding portion in a traverse direction, e. g. perpendicular to the first direction.

The holder proposed for the lighting arrangement according to the invention has a structure designed to be able to achieve stable positioning of the optical element even in cases of severe CTE mismatch, e.g. between the support member and the holder. The first and second holding portions are not aligned, but offset in the traverse direction, thus being able to e.g. form a loop-like structure. A section of the holder in the shape of a loop may act as a spring, i.e. deform. In cases of severe CTE mismatch, the position of the optical element relative to the first direction, e.g. the optical axis, can remain relatively stable, because thermal expansion can be at least partly compensated in the first direction by the first and second holding portions.

According to preferred embodiments, the first holding portion may extend into the first direction beyond the optical element. The second holding portion may then extend from its connection to the optical element also into the first direction. Thus, a loop may be formed.

As explained above, at least a part of the second holding portion extends into the first direction. This should be understood to cover also inclined arrangements, where e.g. the second holding portion forms an angle of, for example, 25-65° to the first direction. Also, this comprises non-angular, e.g. bent or rounded shapes of the second holding portion, as long as they at least partially extend into the first direction. However, it is preferred to provide the first and/or the second holding portions to extend at least substantially straight. In particular, it is preferred that the first and second holding portions may be arranged at least substantially in parallel to each other. The term "at least substantially" should be understood to cover minor variations, such as e.g. +/−15° or less, preferably +/−5° or less.

According to one aspect of the invention, the first and second holding portions are connected by a first connection portion and the first connection portion is arranged to form an angle with both the first and second holding portions. The angle may be e.g. greater than 30°, preferably greater than 60°. In a particularly preferred embodiment, the first and second holding portions are arranged at least substantially at right angles to the first connecting portion.

The second holding portion may be directly attached to the optical element, or the connection may be indirect through one or more intervening elements. In a preferred embodiment, the second holding portion may be connected to the optical element by a second connecting portion. The second connecting portion may extend at least substantially perpendicular (i.e. 90°+/−15°, preferably 90°+/−5°) to the first direction.

The holder may comprise one or more further holding portions besides the first and second holding portions. In some embodiments, the further holding portions may extend into the first direction and be arranged at least substantially in parallel to each other and to the first and second holding portions. The holding portions may be interconnected by connecting portions, which may be arranged perpendicularly. In one embodiment, the lengths of the holding portions differ. Shorter holding portions may be arranged closer to the optical element. The holding portions may be arranged such that each is shorter than the holding portion next to it into the direction away from the optical element.

While the lighting arrangement may offer great advantages already for a single LED lighting element and corresponding optical element, it is particularly preferred to provide a plurality of LED lighting elements and corresponding optical elements arranged relative thereto. In particular, a plurality of LED lighting elements may be arranged on the same support member spaced from each other, e.g. in a line or matrix. The optical elements may be arranged spaced from the LED lighting elements in the same direction. In particular, the optical elements may be connected to each other. The holder may be provided to hold two or more, preferably all of the optical elements in a position relative to the support member to thus ensure exact positioning for all optical elements.

The holder may have many different shapes. Its main function is to define the position of the optical element relative to the support member, i.e. to lock its displacement. Any type, shape or construction of a holder which serves this function, i.e. locks the position of the optical element with respect to at least one, preferably two, further preferably all three of x, y, and z directions may be used.

In preferred embodiments, the holder may be comprised e.g. of a plurality of bars, beams or other structures. Preferably, at least the first and second holding portions may be provided as plane wall elements. The holder may be comprised of a plurality of such plane wall elements. The first connecting portion is provided as a plane wall element having a greater thickness than the first and second holding portions.

In a preferred embodiment, the first and second holding portions may be arranged to surround the optical element. Thus, at least a portion of the holder may be arranged as a housing surrounding the optical element. In particular, the holder may be a box-shaped housing with at least a pair of first housing walls arranged in parallel to each other and a pair of second housing walls arranged in parallel to each other. The first and second housing walls are preferably arranged at least substantially perpendicular to each other.

In a further preferred embodiment, the holder may comprise a base portion, which is e.g. in contact with the support member. A clamp element may be arranged to fix the base portion to the support member. The holder may comprise a flange for engagement with the clamp element.

It is particularly preferred to provide the first and second holding portions of the holder in one piece, e.g. manufactured together in injection moulding. According to one aspect of the invention, the optical element is provided as one piece with both the first and second holding portions, as well as optionally and preferably any connection portions. A holder with an optical element provided in one piece is particularly simple and efficient to manufacture.

These and other aspects of the invention will be apparent from and elucidated with reference to the embodiments described hereinafter.

DETAILED DESCRIPTION OF EMBODIMENTS

Figure 1:
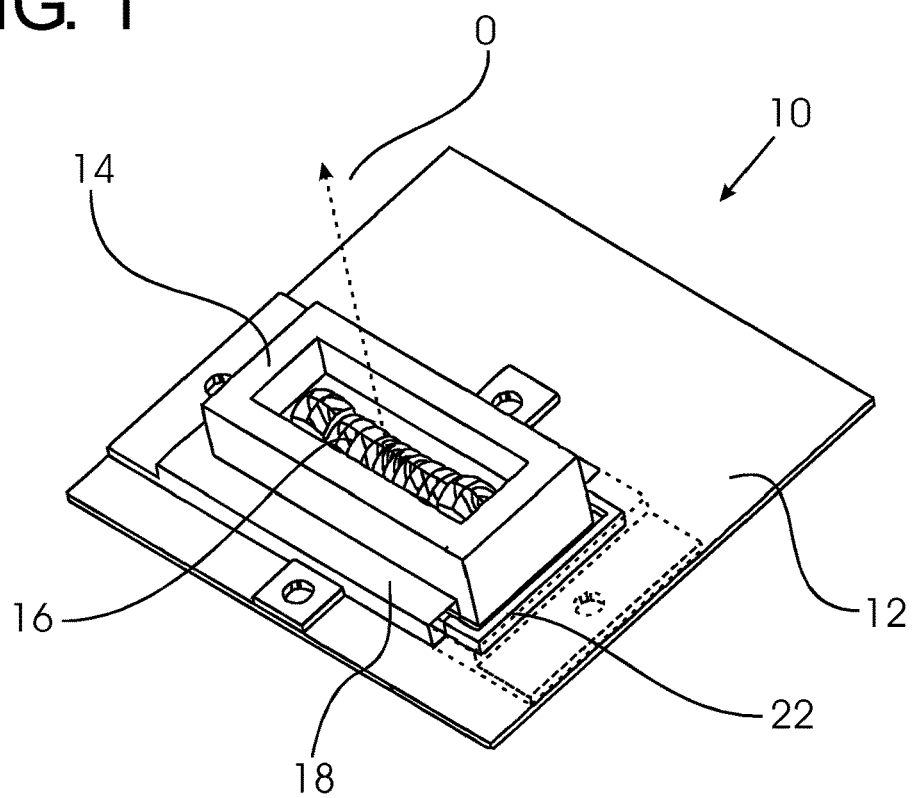
FIG. 1 shows a perspective view of a first embodiment of a lighting arrangement.
Figure 2:
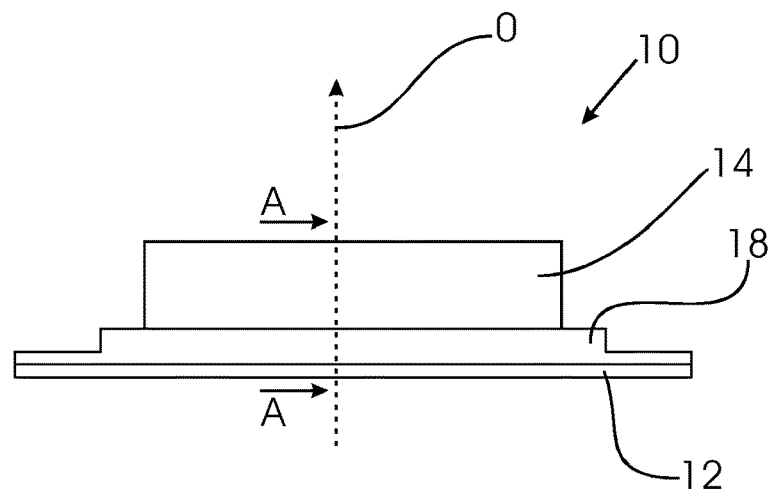
FIG. 2, 3 show a side view and a top view of the lighting arrangement of FIG. 1.
Figure 3:
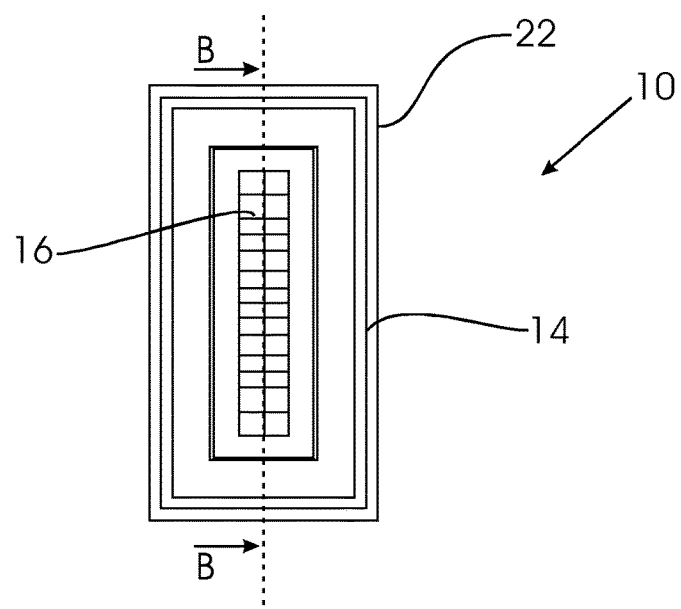

A first embodiment of a lighting arrangement 10 shown in FIG. 1-3 comprises a support member, in the present example a base plate 12, onto which a plurality of light emitting diodes 15 see (FIG. 6—not visible in FIGS. 1-5) and a holder 14 for a number of optical elements 16 are mounted. As the skilled person will understand, the base plate 12 shown is a simple an example of a support member suited for illustration of the holding function of the optical elements 16 relative to the base plate 12. In actual embodiments, the base plate 12 may e.g. be a circuit board. In more detailed embodiments, further components, not shown in the figures, may be arranged on the base plate 12, such as e.g.

electronic components, conductor tracks, thermal interface elements and/or one or more heat sinks.

As shown, the holder 14 is box-shaped to surround the optical elements 16. It has a surrounding flange 22, which is held down by a clamp 18 which may be fixed to the base plate 12 e.g. by a screw connection.

Figure 4:
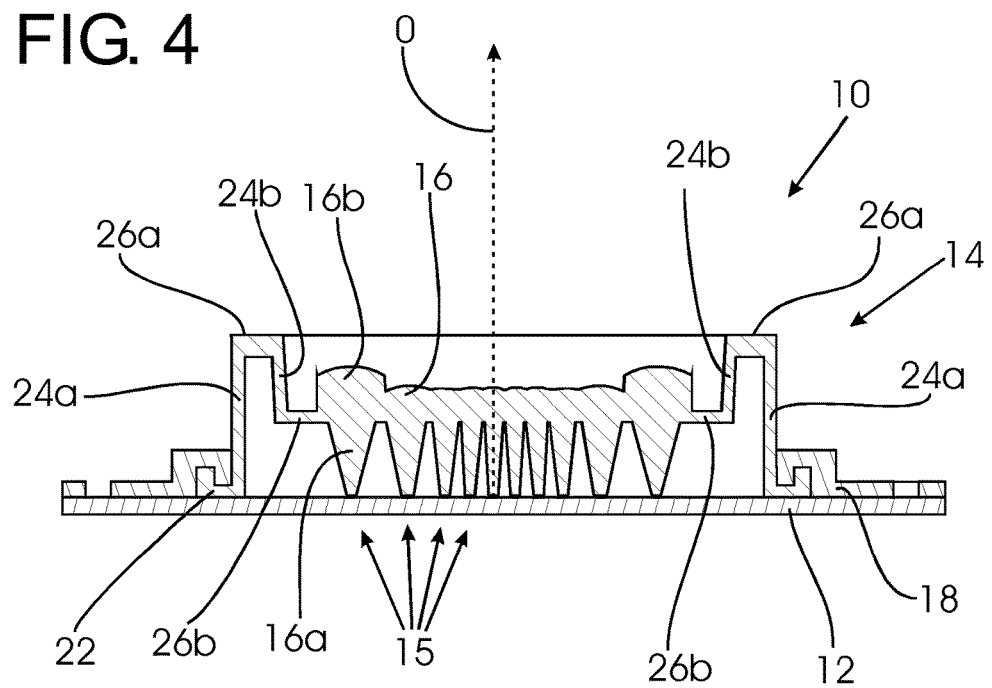
FIG. 4 shows a longitudinal sectional view along B . . . B in FIG. 3.
Figure 5:
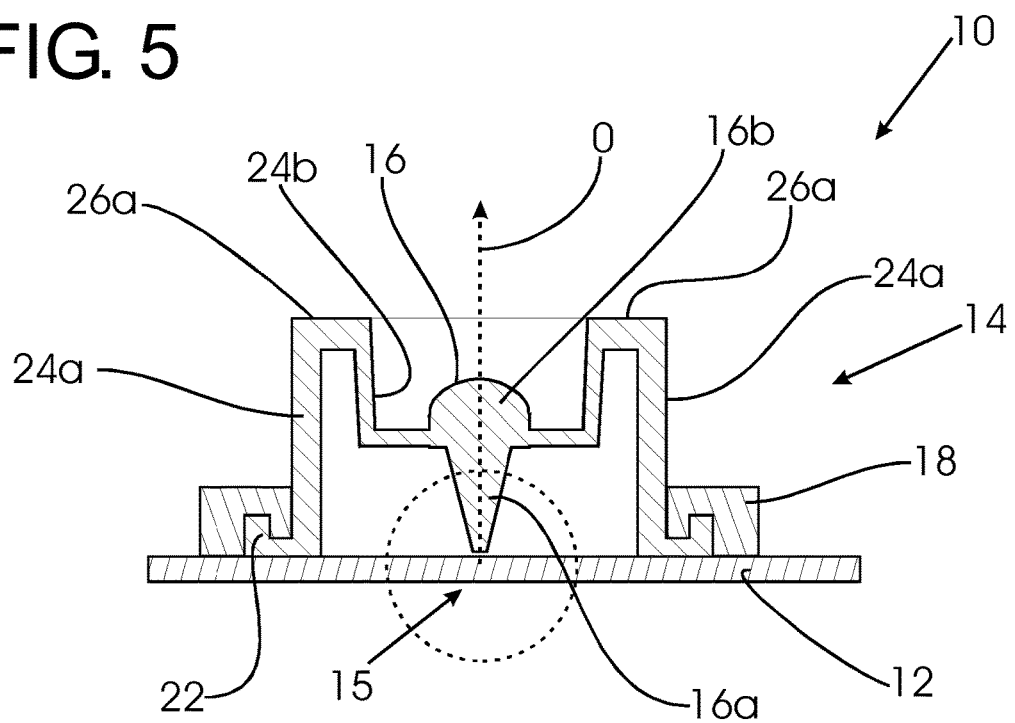
FIG. 5 shows a cross-sectional view along A . . . A in FIG. 2.
Figure 6:
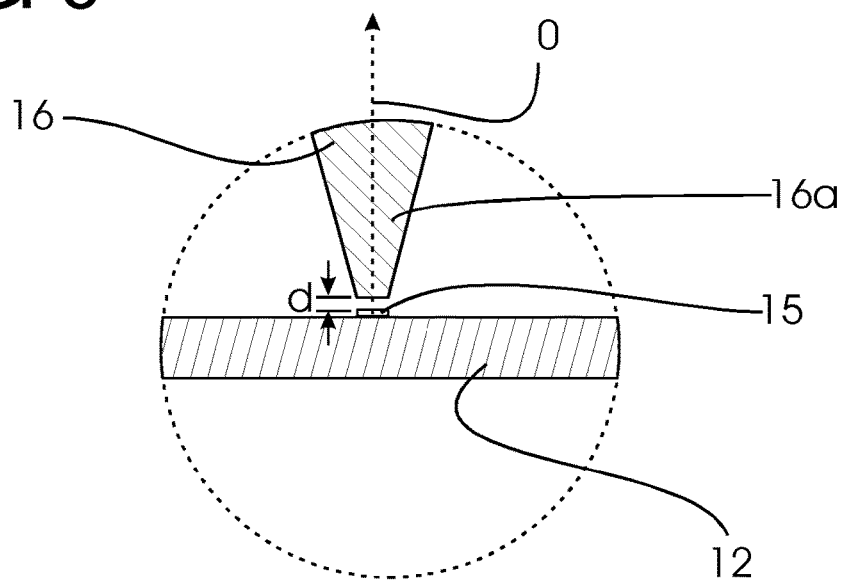
FIG. 6 shows an enlarged view of the portion C in FIG. 5.

FIGS. 4-6 show sectional views of the lighting arrangement 10. As shown in the enlarged view of FIG. 6, LEDs 15 are arranged on the base plate 12. Spaced by a small distance d in the direction of an optical axis O, the optical elements 16 are positioned. A plurality of LED elements 15 are arranged in a line on top of the base plate 12. As shown in FIG. 4, the optical elements 16 are each arranged in front of the individual LED elements 15.

Each optical element 16 comprises a TIR collimator portion 16a arranged towards the LED elements 15 for receiving light therefrom and a lens portion 16b to emit the light as a shaped illumination beam into the direction of the optical axis O. In the example shown, the holder 14 is manufactured in one piece with the optical elements 16, made from a transparent material e.g. silicone.

The LED elements 15 of the lighting arrangement 10 form an LED matrix, which may be e.g. used in automotive front lighting. In particular, the lighting arrangement 10 may be used for adaptive driving lighting, where the LEDs may be operated independently or in segments in order adjust the beam to a specific driving situation. As shown in the figures, in particular FIGS. 4-6, the optical elements 16 are each arranged in front of the LED elements 15. Distance d is preferably very small to allow good coupling of light from the LED element 15 into the TIR collimator portion 16a of each optical element 16.

However, variations of the arrangement of the optical element 16 relative to the LED element 15, and in particular variations to the distance d, can significantly alter the output beam. A variation of the distance d may in particular alter the intensity of the output beam.

Figure 10A:
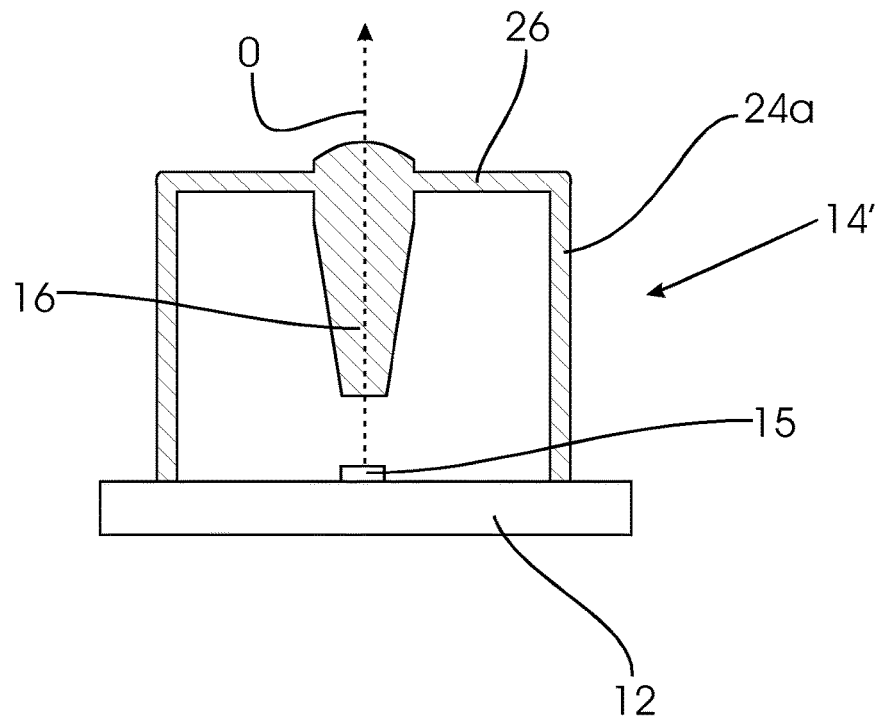
FIG. 10a, 10b show the structure of a holder according to a comparative example.

FIG. 10a shows a schematic representation of a simple box-shaped holder 14' for positioning the optical element 16 relative to the LED element 15. In this comparative example, the holder 14' comprises on each side a first portion 24a extending straight into the direction of the optical axis O and a second portion 26 extending from the end of the first portion 24a at right angles up to the optical element 16.

Figure 10B:
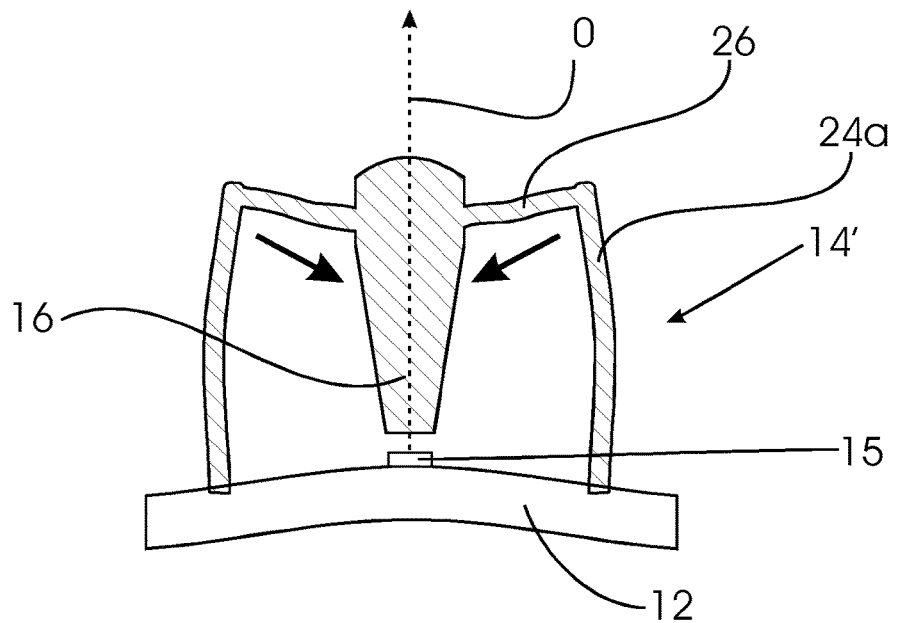

Assuming a significant CTE mismatch between the material of the holder 14' and the base plate 12 in the comparative example, a raised temperature will lead to distortions schematically shown in FIG. 10b. As illustrated, this will lead to a significant change in the relative arrangement of the LED element 15 and optical element 16, in particular with regard to the distance between these two elements.

Figure 9A:
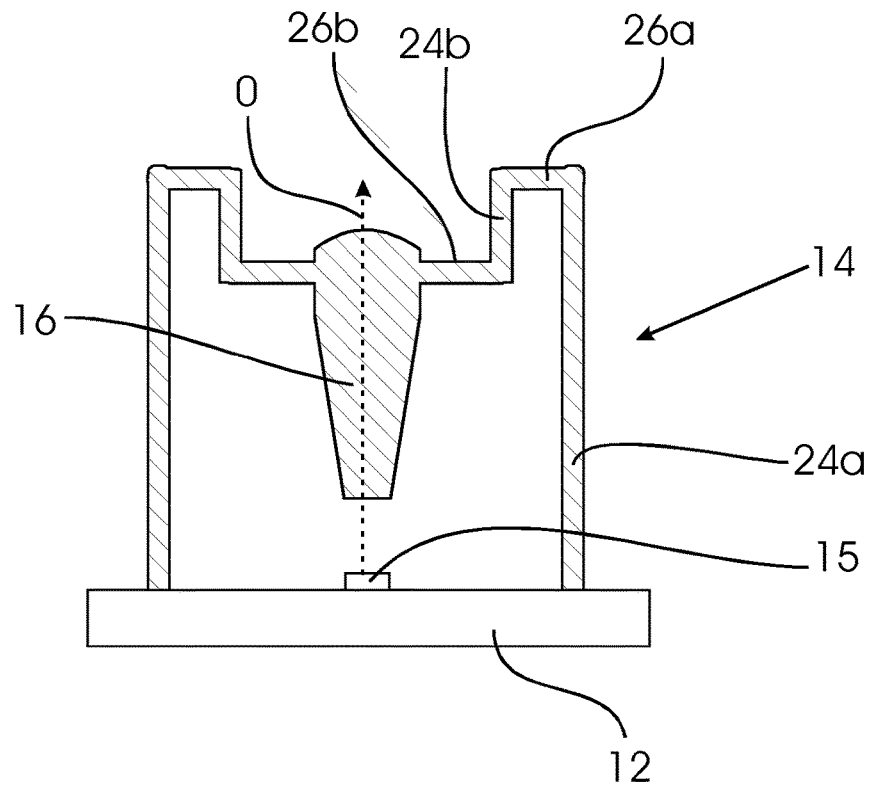
FIG. 9a, 9b schematically show the structure of a holder according to a generic embodiment.
Figure 9B:
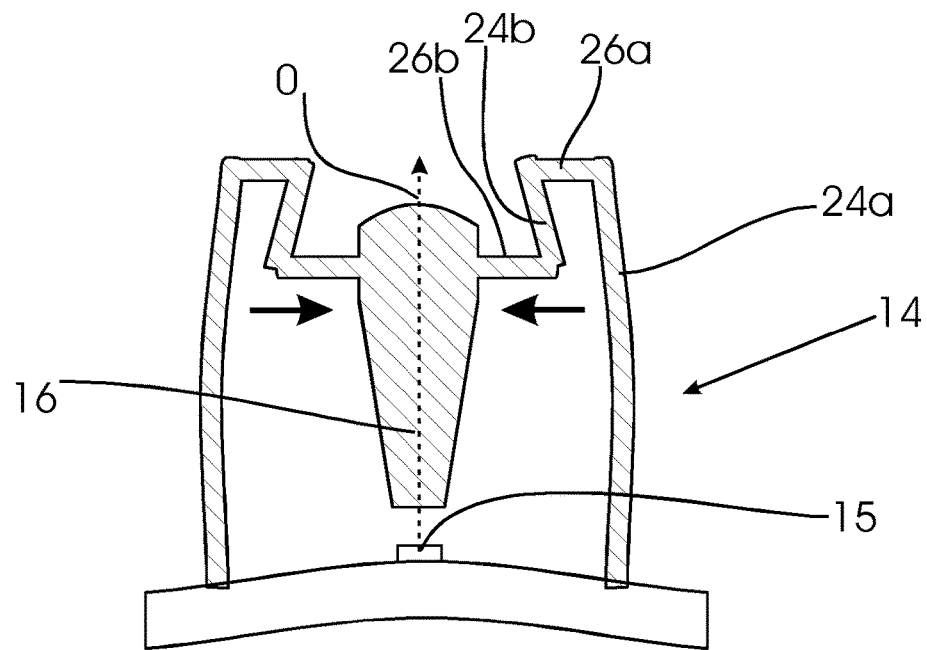

FIGS. 9a, 9b show a generic embodiment of a holder 14 for comparison. In the generic embodiment, the holder 14 comprises on both sides of the optical element 16 a first portion 24a extending into the direction of the optical axis O and a second portion 24b extending parallel thereto, but offset in traverse direction. The first and second holding portions 24a, 24b are connected by a first connection portion 26a extending at right angles to both the first and second holding portions 24a, 24b. The second holding portion 24b is connected to the optical element 16 by a second connecting portion 26b, also arranged at right angles with both the first and second holding portions 24a, 24b.

As shown in FIG. 10a, the first holding portion 10a extends into the direction of the optical axis O beyond the optical element 16. The second holding portion 24b is arranged at a certain distance from the first holding portion 24a, but parallel thereto. The second holding portion 24b, the first connecting portion 26a and the upper part of the first holding portion 24a form a loop-like or spring structure on both sides of the optical element 16.

In a case of increased temperature and severe CTE mismatch as shown in FIG. 9b, the holder 14 undergoes significant distortion, but this does not result in substantial changes in the positioning of the optical element 16. The angular relationship of the holding portion 24a, 24b and the connecting portions 26a, 26b may change and compressive stress in traverse direction may be generated in the optical element 16, but positioning of the optical element 16 with regard to the optical axis O remains relatively constant. The spring/loop structure at least partly compensates the deformation in the first holding portion.

In the first embodiment of a lighting arrangement 10 shown in the sectional views of FIG. 4, 5, the holder 14 is comprised of plane wall elements comprising first (outer) holding portions 24a which extend straight into the direction of the optical axis O and second (inner) holding portions 24b arranged spaced therefrom in parallel. As in the generic embodiment of FIG. 9a, 9b, first connecting portions 26a are arranged in traverse direction to connect the first and second holding portions 24a, 24b, and second connection portions 26b are arranged to connect the second holding portions 24b to the optical element 16.

Figure 7:
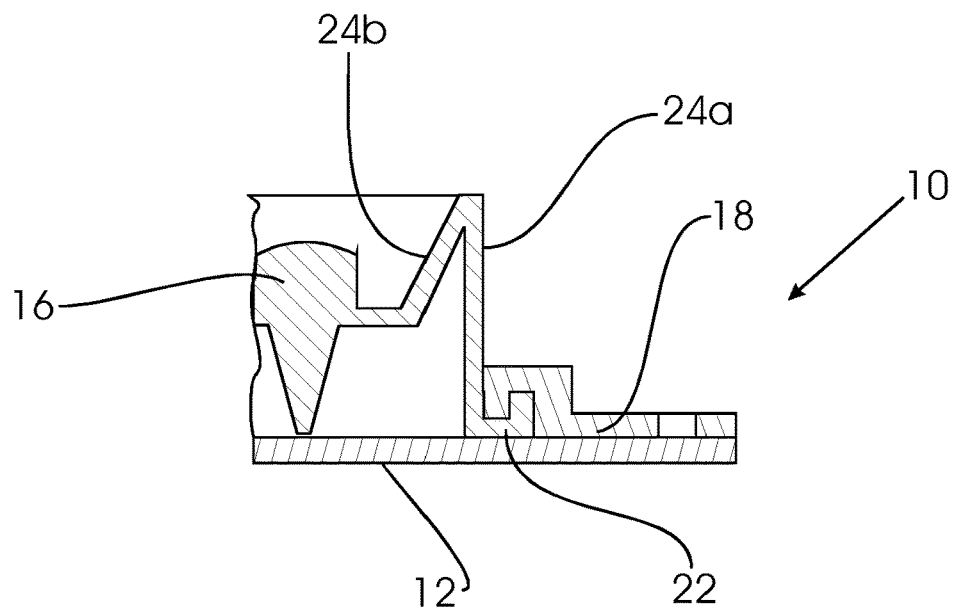
FIG. 7 shows a partial cross-sectional view of a second embodiment of a lighting arrangement.

FIG. 7, 8, 11 show alternative embodiments of lighting arrangements 10, which differ from the lighting arrangement 10 according to the first embodiment by the shape and arrangement of the first and second holding portions 24a, 24b.

Figure 8:
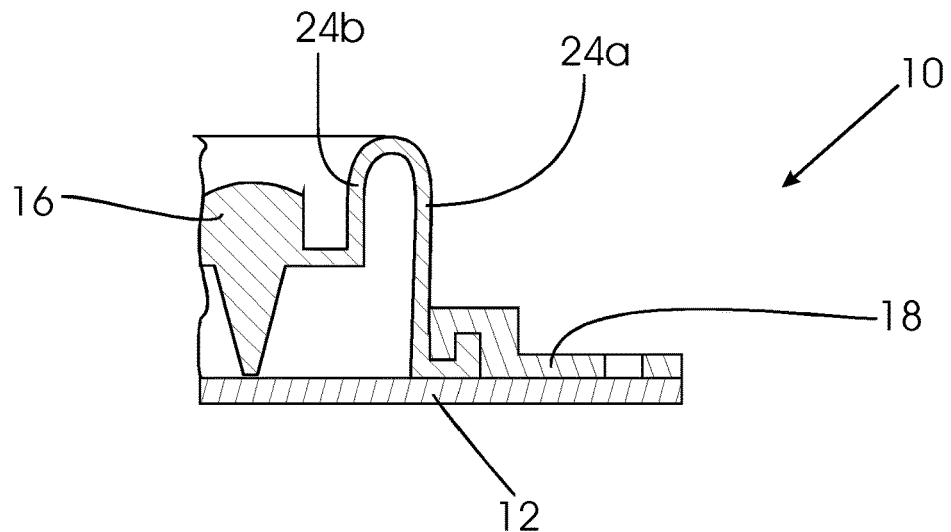
FIG. 8 shows a partial cross-sectional view of a third embodiment of a lighting arrangement.

In the second embodiment according to FIG. 7, the first and second holding portions 24a, 24b are arranged at an angle of e. g. 30°. In the third embodiment according to FIG. 8, the first and second holding portions 24a, 24b are connected by a curved portion.

Figure 11:
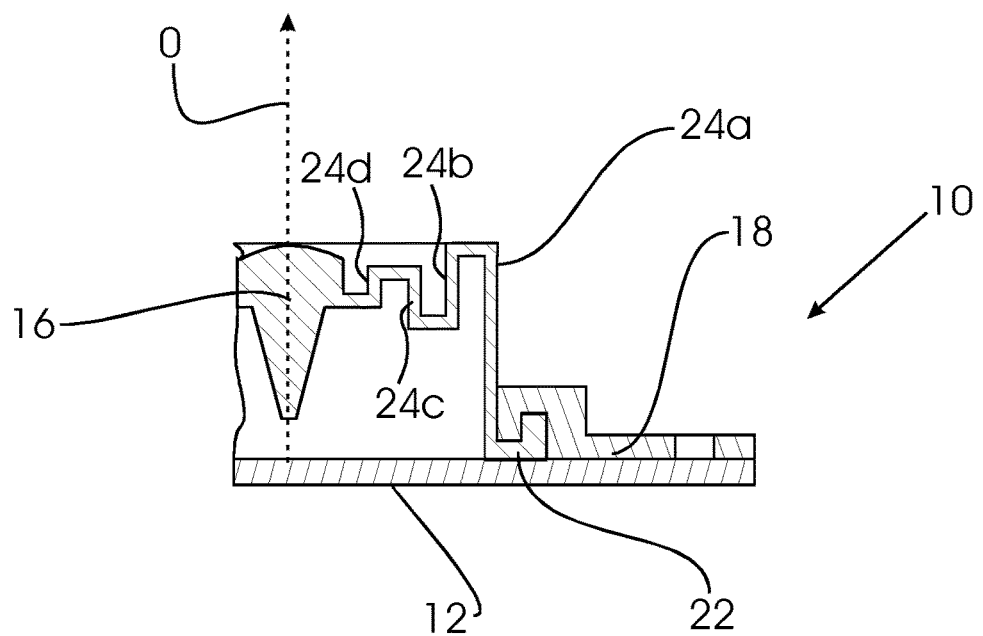
FIG. 11 shows a partial cross-sectional view of a fourth embodiment of a lighting arrangement.

In the fourth embodiment according to FIG. 11, there are further holding portions 24c, 24d extending in parallel into the direction of the optical axis O besides the first and second holding portions 24a, 24b. All holding portions 24a-24d are arranged spaced from each other and are interconnected by perpendicular connecting portions. The holding portions 24a-24d are of different length, being shorter the closer they are to the optical element 16. Thus, a plurality of loop/spring structures is formed, which in the event of distortion due to CTE mismatch effectively compensates displacement in the direction of the optical axis O.

For a CTE mismatch between the material of the base plate 12 with the material of the holder 14 and optical element 16, all of the described holding structures show an improved behaviour over the comparative example of FIG. 10a, 10b. Best results have been obtained with the holder 14 according to the first embodiment.

While the invention has been illustrated and described in detail in the drawings and forgoing description, such illustration and description are to be considered illustrative or exemplary and not restrictive; the invention is not limited to the disclosed embodiments.

For example, while the above embodiments show a plurality of LEDs 15 in a line and correspondingly aligned optical elements 16, embodiments with only a single LED or optical element 16, or with other arrangements such as two-dimensional matrices of LED's and corresponding optical elements 16 may be provided. While the holder 14 and optical element 16 in the embodiments are provided as one piece, to be manufactured e.g. by injection moulding, alternative embodiments are conceivable with separate parts.

Also, as illustrated by the different shapes shown in FIG. 7, 8, the specific shape of the first and second holding portions 24a, 24b may vary as long as at least a portion of both extends into the direction of the optical axis O, even if it is bent, rounded or inclined. Other variations to the disclosed embodiment can be understood and effected by those skilled in the art in practicing the claimed invention, from a study of the drawings, the disclosure and the appended claims.

In the claims, the word "comprising" does not exclude other elements, and the indefinite article "a" or "an" does not exclude a plurality.

The mere fact that certain measures are recited in mutually different dependent claims or embodiments does not indicate that a combination of these measures cannot be used to advantage.

Any reference signs in the claims should not be construed as limiting the scope.

The invention claimed is:

1. A lighting arrangement comprising:
    at least one light emitting diode (LED) lighting element arranged on a support member;
    an optical element arranged spaced from the LED lighting element in a first direction; and
    a holder to hold the optical element in a position relative to the LED lighting element, the holder comprising at least a first holding portion extending from the support member into the first direction and a second holding portion connected to the optical element arranged such that at least a part of the second holding portion extends into the first direction,
    wherein the second holding portion is spaced from the first holding portion in a direction traverse to the first direction,
    wherein the first holding portion and the second holding portion are connected by a first connecting portion arranged to form an angle with both the first holding portion and the second holding portion,
    wherein the first connecting portion is a plane wall element having a greater thickness than the first holding portion and the second holding portion, and
    wherein the optical element is one piece with the first holding portion and the second holding portion.

2. The lighting arrangement of claim 1, wherein the first holding portion extends into the first direction beyond the optical element.

3. The lighting arrangement of claim 1, wherein the first holding portion and the second holding portion are substantially parallel to each other.

4. The lighting arrangement of claim 1, wherein the first connecting portion extends substantially perpendicular to the first direction.

5. The lighting arrangement of claim 1, wherein the second holding portion is connected to the optical element by a second connecting portion extending substantially perpendicular to the first direction.

6. The lighting arrangement of claim 1, further comprising:
    a plurality of LED lighting elements arranged on the support member spaced apart from each other; and
    a plurality of optical elements arranged spaced apart from the plurality of LED lighting elements in the first direction, wherein the plurality of optical elements are connected to each other.

7. The lighting arrangement of claim 1, wherein the first holding portion and the second holding portion are plane wall elements.

8. The lighting arrangement of claim 1, wherein the first holding portion and the second holding portion surround the optical element.

9. The lighting arrangement of claim 1, wherein the holder is a box shaped housing comprising at least a pair of first housing walls parallel to each other and a pair of second housing walls parallel to each other, first housing walls and the second housing walls substantially perpendicular to each other.

10. The lighting arrangement of claim 1, wherein the holder element comprises a base portion and a clamp element affixing the base portion to the support member.

11. The lighting arrangement of claim 1, wherein the optical element comprises one or more of a collimator element and a lens element.

* * * * *